(12) United States Patent
Sakai et al.

(10) Patent No.: US 7,770,452 B2
(45) Date of Patent: Aug. 10, 2010

(54) SEMICONDUCTOR SENSOR AND MANUFACTURING METHOD THEREFOR

(75) Inventors: Minekazu Sakai, Kariya (JP); Ryuichiro Abe, Ichinomiya (JP); Akitoshi Yamanaka, Hekinan (JP)

(73) Assignee: DENSO CORPORATION, Kariya (JP)

( * ) Notice: Subject to any disclaimer, the term of this patent is extended or adjusted under 35 U.S.C. 154(b) by 169 days.

(21) Appl. No.: 12/081,512

(22) Filed: Apr. 17, 2008

(65) Prior Publication Data

US 2008/0196501 A1 Aug. 21, 2008

Related U.S. Application Data

(62) Division of application No. 11/455,919, filed on Jun. 20, 2006, now Pat. No. 7,373,821.

(30) Foreign Application Priority Data

Jul. 6, 2005 (JP) ............................. 2005-197412

(51) Int. Cl.
*G01P 15/00* (2006.01)
(52) U.S. Cl. ................................... 73/514.01
(58) Field of Classification Search ................ None
See application file for complete search history.

(56) References Cited

U.S. PATENT DOCUMENTS

| 5,185,498 | A | 2/1993 | Sanftleben et al. |
| 5,545,912 | A | 8/1996 | Ristic et al. |
| 5,571,994 | A | 11/1996 | Norton |
| 6,294,028 | B1 | 9/2001 | Bell et al. |
| 6,323,550 | B1 | 11/2001 | Martin et al. |
| 6,429,506 | B1 | 8/2002 | Fujii et al. |
| 6,656,368 | B2 | 12/2003 | Schoefthaler et al. |
| 6,787,866 | B2 | 9/2004 | Fujii et al. |
| 6,861,848 | B2 | 3/2005 | Kasai et al. |
| 6,949,807 | B2 | 9/2005 | Eskridge et al. |
| 6,951,824 | B2 | 10/2005 | Fischer et al. |
| 7,091,109 | B2 | 8/2006 | Fujii et al. |
| 7,298,022 | B2 | 11/2007 | Fujii et al. |

FOREIGN PATENT DOCUMENTS

| JP | A-10-256293 | 9/1998 |
| JP | A-2003-254988 | 9/2003 |

OTHER PUBLICATIONS

Office Action mailed Oct. 6, 2009 in corresponding Japanese patent application No. 2005-197412 (and English translation).

*Primary Examiner*—Robert R Raevis
(74) *Attorney, Agent, or Firm*—Posz Law Group, PLC

(57) ABSTRACT

A semiconductor sensor is disclosed that includes a semiconductor substrate, a sensing portion provided on the semiconductor substrate, and a pad in electrical communication with the sensing portion and provided on the semiconductor substrate. The semiconductor sensor also includes a bonding wire in electrical communication with the pad. Furthermore, the semiconductor sensor includes a cover member with a covering portion disposed over the semiconductor substrate for covering the sensing portion such that the covering portion is separated at a distance from the sensing portion. The cover member further includes a coupling portion provided on the semiconductor substrate at an area including the pad and for enabling electrical connection of the pad with the bonding wire therethrough.

8 Claims, 7 Drawing Sheets

SEMICONDUCTOR SENSOR AND MANUFACTURING METHOD THEREFOR

CROSS REFERENCE TO RELATED APPLICATION(S)

This application is a divisional application of U.S. application Ser. No. 11/455,919, which was filed on Jun. 20, 2006. This application is based upon and claims priority to Japanese Patent Application 2005-197412, filed Jul. 6, 2005, which is incorporated herein in its entirety by reference.

FIELD OF THE INVENTION

The present invention generally relates to a semiconductor sensor and, more particularly, to a semiconductor sensor with a cover member and a method of manufacturing the same.

BACKGROUND

Semiconductor sensors have been designed that include a semiconductor substrate, sensing portions provided over one surface of the semiconductor substrate, and pads provided on the periphery of the sensing portions over the one surface of the semiconductor substrate. In such a semiconductor sensor, bonding wires are electrically connected to the pads. Also, signals from the sensing portions are transmitted through the pads and through the bonding wires. (See e.g., Japanese Patent Application 2003-531017, which relates to U.S. Pat. No. 6,951,824, and Japanese Patent Publication 2002-504026, which relates to U.S. Pat. No. 6,656,368.)

In these prior art semiconductor sensors, a cover member formed of semiconducting material can be provided over one surface of the substrate to protect the sensing portions. This cover member is formed through sacrificial layer etching and multiple film formation processes or by attaching it to a semiconductor substrate with low-melting glass or another suitable adhesive material.

The cover member covers the sensing portions, and yet the cover member is separated from the sensing portions at a distance. Thus, the cover member is unlikely to contact the sensing portions. Also, foreign matter is unlikely to contact the sensing portions. Therefore, the sensing portions are appropriately protected, and sensor characteristics can be maintained.

To maintain electrical connection between the pads and the bonding wires, the cover member covers the sensing portions over one surface of the semiconductor substrate, and the cover is spaced from the pads.

However, these prior art semiconductor sensors have certain disadvantages. First, forming the cover member via sacrificial layer etching and multiple film formation processes can be difficult. Also, an attachment region between the sensing portions and the pads for coupling the cover member is typically provided for coupling the cover member. This attachment is relatively large (e.g., 5 mm) and can undesirably increase the size of the semiconductor sensor. For instance, when the cover member is attached with adhesive material, the attachment region is typically large to allow for possible flow of the adhesive material.

SUMMARY OF THE INVENTION

A semiconductor sensor is disclosed that includes a semiconductor substrate, a sensing portion provided on the semiconductor substrate, and a pad in electrical communication with the sensing portion and provided on the semiconductor substrate. The semiconductor sensor also includes a bonding wire in electrical communication with the pad. Furthermore, the semiconductor sensor includes a cover member with a covering portion disposed over the semiconductor substrate for covering the sensing portion such that the covering portion is separated at a distance from the sensing portion. The cover member further includes a coupling portion provided on the semiconductor substrate at an area including the pad and for enabling electrical connection of the pad with the bonding wire therethrough.

A method of manufacturing a semiconductor sensor is also disclosed that includes providing a sensing portion on a semiconductor substrate and providing a pad in electrical communication with the sensing portion on the semiconductor substrate. The method also includes providing a cover member with a covering portion and a coupling portion. The method further includes providing the coupling portion of the cover member on the semiconductor substrate on an area including the pads such that the covering portion covers the sensing portion and such that the covering portion is separated at a distance from the sensing portion. Moreover, the method includes electrically coupling a bonding wire to the pad through the coupling portion for transmission of signals output by the sensing portion.

DETAILED DESCRIPTION OF THE PREFERRED EMBODIMENTS

Figure 1:
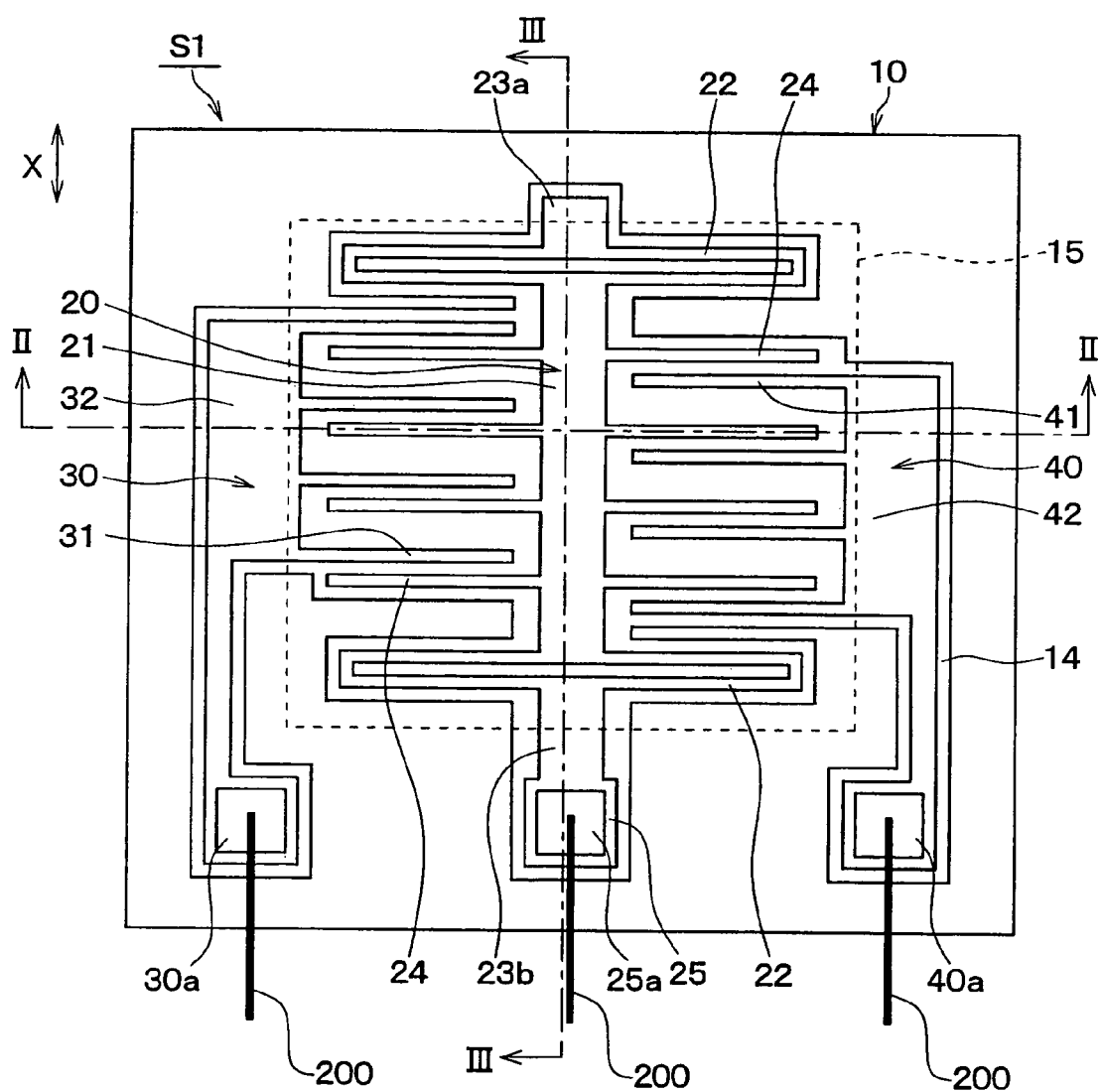
FIG. 1 is a schematic plan view of one embodiment of a semiconductor sensor.

Hereafter, description will be given to embodiments of the invention. In the following drawings, identical or equivalent parts will be marked with the same reference numerals for the simplification of description.

Figure 2:
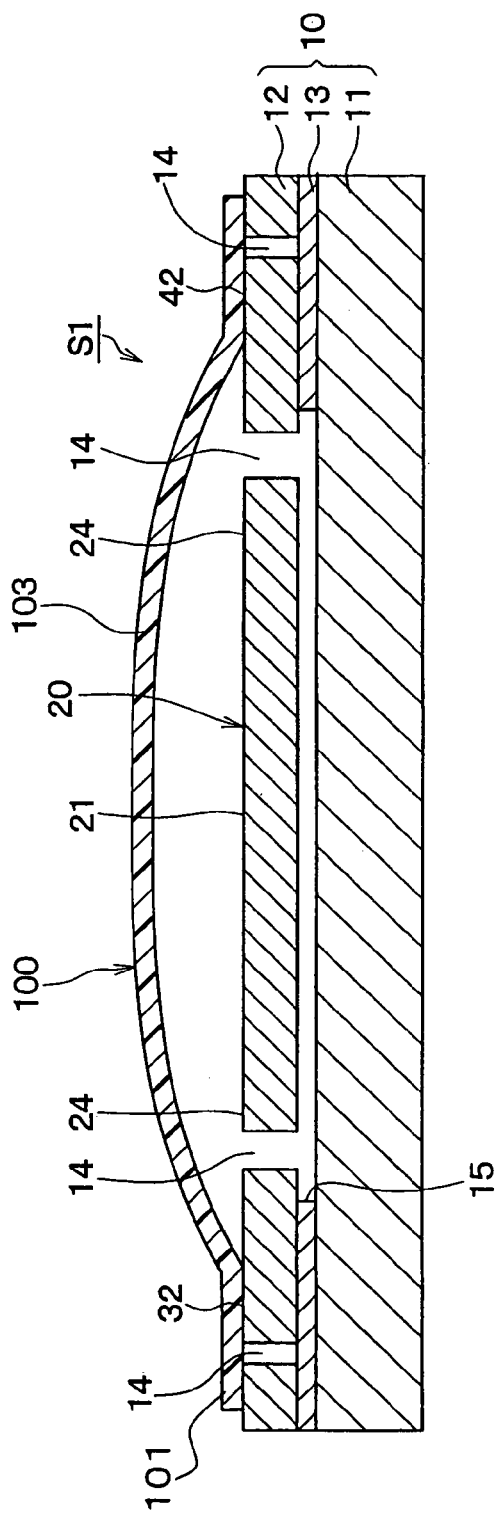
FIG. 2 is a schematic sectional view of the semiconductor sensor taken along line II-II of FIG. 1.
Figure 3:
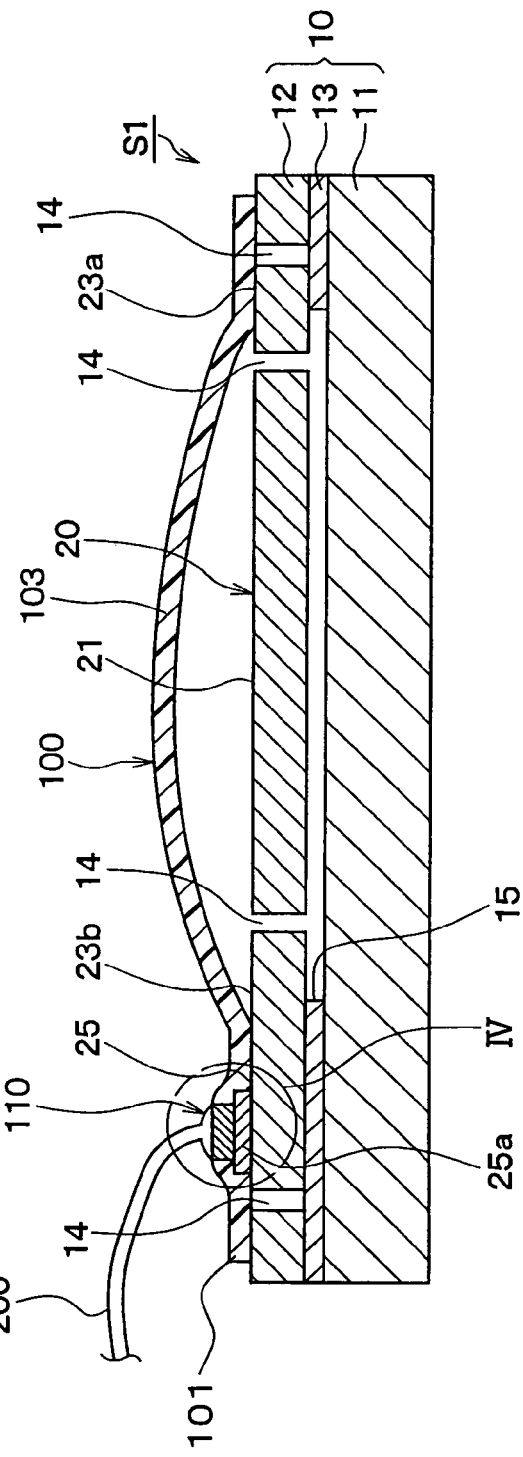
FIG. 3 is a schematic sectional view of the semiconductor sensor taken along line III-III of FIG. 1.

Referring initially to FIGS. 1-3, one embodiment of a semiconductor sensor S1 is illustrated. In one embodiment, the semiconductor sensor S1 is a differential capacitive semiconductor acceleration sensor, one of capacitive mechanical quantity sensors. The semiconductor sensor S1 could be as an acceleration sensor for automobiles or a gyro sensor for controlling the operation of air bags, ABS, VSC, and the like. However, it will be appreciated that the semiconductor sensor S1 could be of any type and could be used in any manner without departing from the scope of the present disclosure.

As illustrated in FIG. 1 to FIG. 3, the semiconductor acceleration sensor S1 includes a semiconductor substrate 10. In one embodiment, the semiconductor substrate 10 is formed by subjecting this semiconductor substrate 10 to a publicly known micromachining process. For instance, as illustrated in FIG. 2 and FIG. 3, the semiconductor substrate 10 is a rectangular SOI (Silicon On Insulator) substrate 10. It has an oxide film 13 as insulating layer between a first silicon substrate 11 as first semiconductor layer and a second silicon substrate 12 as second semiconductor layer.

Trenches 14 penetrate the second silicon substrate 12 in the direction of the thickness of the second silicon substrate 12 in a predetermined pattern. In the embodiment shown, for instance, there are formed comb-like beam structures 20, 30, 40, which include a movable portion 20 and fixed portions 30, 40.

The oxide film 13 is removed in regions where the beam structures 20 to 40 are disposed (i.e., the portion indicated by the broken rectangular line rectangle 15 in FIG. 1). Thus, an opening 15 is formed in the oxide film 13 in the space enclosed by the broken rectangular line.

The movable portion 20 includes a long and thin rectangular spindle portion 21 and spring portions 22 coupled at both ends. The movable portion 20 is integrally coupled with anchor portions 23a, 23b through the spring portions 22 and is supported by them.

As illustrated in FIG. 3, the anchor portions 23a, 23b are fixed at the rim of the opening 15, and the anchor portions 23a, 23b are supported above the first silicon substrate 11. The spindle portion 21 and the spring portions 22 are disposed over the opening 15.

As illustrated in FIG. 1, the spring portions 22 are in the shape of rectangular frame in which two parallel beams are coupled with each other at both ends. They have a spring function and are displaced in the direction orthogonal to the direction of the length of the two beams. Through these spring portions 22, the movable portion 20 can be displaced above the first silicon substrate 11 in the direction of arrow X in response to an acceleration.

As illustrated in FIG. 1, the movable portion 20 has comb-like movable electrodes 24. In this example, four movable electrodes 24 are protrudingly formed on the left side and the right side of the spindle portion 21, respectively, and they face onto the opening 15. The movable electrodes 24 can be displaced in the direction of arrow X as the movable portion 20 formed integrally with the spring portions 22 and the spindle portion 21.

The fixed portion 30 positioned on the left side of the spindle portion 21 in FIG. 1 includes a plurality of left-side fixed electrodes 31 and a wiring portion 32 for the left-side fixed electrodes 31. The fixed portion 40 positioned on the right side of the spindle portion 21 in FIG. 1 includes a plurality of right-side fixed electrodes 41 and a wiring portion 42 for the right-side fixed electrodes 41.

The wiring portions 32, 42 are fixed over the oxide film 13. The wiring portions 32, 42 are fixed, respectively, at opposite sides of the semiconductor sensor S1 adjacent the rim of the rectangular opening 15. The wiring portions 32, 42 are supported above the first silicon substrate 11 with the oxide film 13 interposed therebetween.

In embodiment shown in FIG. 1, the multiple fixed electrodes 31 are disposed between the movable electrodes 24 on one side of the movable portion 20, and the fixed electrodes 31 are disposed between the movable electrodes 24 on an opposite side of the movable portion 20. The fixed electrodes 31, 41 are cantilevered over the opening 15 and are supported by the respective wiring portions 32, 42.

Thus, a detection gap for detecting capacitance is formed in each gap between a side face of a movable electrode 24 and a side face of a fixed electrode 31 or 41. In other words, the movable portion 20 and the fixed electrodes 31, 41 opposed to the movable electrodes 24 of the movable portion 20 with detection gaps in-between are constructed as sensing portions 20, 31, and 41 that generate detection signals for acceleration.

Furthermore, a pad 30a for the left-side fixed electrodes and a pad 40a for the right-side fixed electrodes are disposed in predetermined positions over the wiring portion 32 for the left-side fixed electrodes and the wiring portion 42 for the right-side fixed electrodes, respectively. A wiring portion 25 for the movable electrodes is formed so that it is integrally coupled with one anchor portion 23b. A pad 25a for the movable electrodes is formed in a predetermined position over this wiring portion 25. The pads 25a, 30a, and 40a for the respective electrodes are formed by sputtering or evaporating aluminum, for example.

Thus, the semiconductor acceleration sensor S1 includes the sensing portions 20, 31, and 41 provided over the surface of the semiconductor substrate 10 (i.e., over the second silicon substrate 12). The sensor S1 also includes the pads 25a, 30a, 40a provided on the periphery of the sensing portions 20, 31, 41 over the surface of the semiconductor substrate 10 (i.e., over the second silicon substrate 12).

The semiconductor acceleration sensor S1 also includes a plurality of bonding wires 200, as illustrated in FIGS. 1 and 3. The bonding wires 200 are in electrical communication with corresponding ones of the pads 25a, 30a, 40a for transmission of signals output by corresponding ones of the sensing portions 20, 31, 41.

These bonding wires 200 can be formed of gold, aluminum, or the like. Also, the bonding wires 200 can be electrically bonding by a known wire bonding method, such as thermo-compression bonding, ultrasonic bonding (i.e., metal junction), or the like.

The pads 25a, 30a, and 40a are electrically connected with a circuit chip, not shown, via these bonding wires 200. The circuit chip has a detector circuit (not shown) for processing the output signals from the semiconductor acceleration sensor S1.

Furthermore, the sensor S1 includes a cover member 100. In one embodiment, the cover member 100 is formed at least partially of resin, such as a resin film. The cover member 100 is provided over one surface of the semiconductor substrate 10. The cover member 100 includes a covering portion 103 and a coupling portion 101. The covering portion 103 covers the sensing portions 20, 31, 41 such that the covering portion 103 is disposed at a distance from the sensing portions 20, 31, 41. The coupling portion 101 is coupled to the substrate 10 (i.e., over the surface of the second silicon substrate 12 on the periphery of the sensing portions 20, 31, 41). The coupling portion 101 is also coupled to the pads 25a, 30a, 40a. More specifically, the coupling portion 101 of the cover member 100 is coupled to the semiconductor substrate 10 at the surface of the second silicon substrate 12 at the rim of the opening 15. In this embodiment, the coupling portion 101 of the cover member 100 covers the pads 25a, 30a, 40a.

As illustrated in FIG. 3, the bonding wires 200 are electrically connected to the pads 25a, 30a, 40a even though the coupling portion 101 of the cover member 100 is coupled to the pads 25a, 30a, 40a. This electrical connection between one of the pads 25a, 30a, 40a and a bonding wire 200 is indicated by reference numeral 110 in FIG. 3. Hereafter, it will be referred to as "pad-wire electrical connection 110."

More detailed description will be given to the construction of the cover member 100 and the pad-wire electrical connections 110 with reference to FIG. 4 as well. Although FIG. 4 is an enlarged view of the pad-wire electrical connection 110 for the pad 25a, it will be appreciated that the pad-wire electrical connection 110 could be the same for the other pads 30a, 40a.

Figure 4:
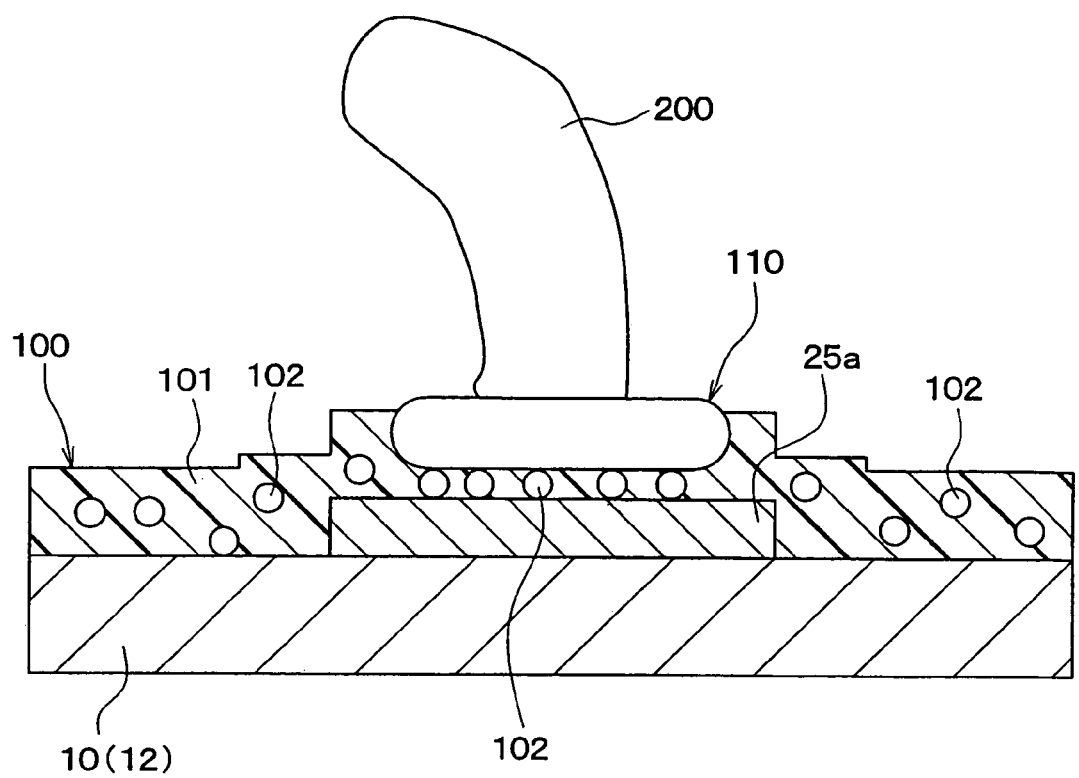
FIG. 4 is an enlarged view of the portion IV of FIG. 3.

As illustrated in FIG. 4, the cover member 100 contains conductive members 102 at least at the portions of the cover member 100 corresponding to the pads 25a, 30a, 40a. That is, the cover member 100 contains the conductive members 102 at portions where the pads 25a, 30a, 40a and the bonding wires 200 are to be electrically connected with each other. As will be explained in greater detail, the conductive members 102 establish electrical communication between the pads 25a, 30a, 40a and the corresponding bonding wires 200.

In the embodiment shown, the conductive members 102 are conductive particles. Thus, in the example illustrated in FIG. 4, a publicly known anisotropic conductive film (ACF) is used as the material of the cover member 100. The cover member 100 is prepared by uniformly dispersing the conductive particles. More specifically, the conductive particles are formed of resin beads plated with gold or the like, and a material, such as polyimide is used as a thermosetting adhesive. The thickness of the cover member 100 is, for example, approximately 50 μm, and the diameter of each conductive particle 102 is approximately 2 μm.

Such a cover member 100 can be easily formed by die forming or the like. The coupling portion 101 of the cover member 100 is coupled to the rim of the opening 15 by applying heat and pressure.

Furthermore, the covering portion 103 is dome shaped above the sensing portions 20, 31, 41, and the covering portion 103 protrudes away from the sensing portions 20, 31, 41 as shown in FIGS. 2 and 3. As shown, the domed portion is substantially positioned over the opening 15. The planar shape of the domed portion 15 is rectangular and this shape is substantially the same as the opening 15. Because the covering portion 103 is dome shaped, space is created between the cover member 100 and the sensing portions 20, 31, 41.

In one embodiment, the dome shape of the covering portion 103 is formed by press forming, in which the resin film is plastically deformed by welding pressure. In another embodiment, the dome shape of the covering portion 103 is formed by suction, in which the resin film is plastically deformed by suction force.

In one embodiment, the pad-wire electrical connections 110 are formed by carrying out wire bonding on the pads 25a, 30a, 40a over the cover member 100. More specifically, wire bonding is carried out on the pads 25a, 30a, 40a covered by the coupling portion 101 of the cover member 100. Specifically, thermocompression bonding or ultrasonic bonding is carried out to electrically connect the bonding wires 200 and the corresponding pads 25a, 30a, 40a. As such, the bonding wires 200 are pressed against the coupling portion 101 of the cover member 100, and as a result, the cover member 100 is deformed.

The deformed cover member 100 at the pad-wire electrical connections 110 is illustrated in FIG. 4. As shown, the pressure from the bonding wire 200 displaces the conductive particles 102 located at the pad-wire electrical connection 110. Consequently, the bonding wires 200 and the conductive particles 102 are brought into contact with each other, and the pads 25a, 30a, and 40a and the conductive particles 102 are brought into contact with each other. As a result, the bonding wires 200 and the pads 25a, 30a, 40a are electrically connected with each other through the conductive particles 102 by metal junction or the like, and electrical continuity is provided between them.

Description will be given to the detecting operation of the semiconductor acceleration sensor S1 in this embodiment. This embodiment is so constructed that acceleration is detected based on change in capacitance at the sensing portions 20, 31, 41. That is, acceleration is detected based on change in the capacitance between the movable electrodes 24 and the fixed electrodes 31, 41 associated with application of acceleration.

In the semiconductor acceleration sensor S1, as mentioned above, the side faces (i.e. detector planes) of fixed electrodes 31, 41 are provided opposite to the side faces (i.e. detector planes) of the individual movable electrodes 24. A detection gap for detecting capacitance is formed in each gap between the opposite side faces of both the electrodes.

First capacitance CS1 is detection capacitance between the left-side fixed electrodes 31 and the movable electrodes 24. Second capacitance CS2 is detection capacitance between the right-side fixed electrodes 41 and the movable electrodes 24. When acceleration is applied to the sensor S1 in the X-direction, the movable portion 20 is integrally displaced in the direction of arrow X. As a result, the capacitance CS1 and CS2 varies.

Therefore, acceleration in the direction of arrow X can be detected based on change in differential capacitance (CS1−CS2) produced due to the change in the gaps between the left and right movable electrodes 24 and the fixed electrodes 31, 41.

A signal based on this difference (CS1−CS2) in capacitance is outputted as an output signal from the semiconductor acceleration sensor S1 through the bonding wires 200. This signal is processed by the above-mentioned circuit chip, from which the signal is finally outputted.

In order to manufacture the semiconductor acceleration sensor S1, a plurality of semiconductor substrates 10 are formed in a wafer. In other words, a semiconductor wafer is subjected to publicly known semiconductor processes. The wafer is then separated into chips to obtain the individual semiconductor substrates.

First, a mask with a shape corresponding to the above-mentioned beam structures 20, 30, 40 is formed over the second silicon substrate 12 of the semiconductor substrate 10 in the form of wafer by photolithography. In other words, a mask is formed having openings corresponding to the above-mentioned trenches 14.

Thereafter, trench etching is performed by dry etching or the like using such gas as $CF_4$ or $SF_6$ to form the trenches 14 extended from the surface of the second silicon substrate 12 to the oxide film 13. Thus, a pattern of the beam structures 20, 30, 40 is formed. Subsequently, the oxide film 13 is partly removed by sacrificial layer etching or the like using hydrofluoric acid or the like to form the opening 15.

In addition, the pads 25a, 30a, 40a are formed by photolithography and sputtering film formation or the like. Thus, the movable portion 20 is released, and the semiconductor acceleration sensor S1 is formed with respect to each of multiple chips in the semiconductor wafer. In one embodiment, neither the cover member 100 nor the bonding wires 200 have been affixed to the sensor S1.

Thus, at this point, the cover member 100 with respect to each of the multiple chips is prepared. The resin film of the cover member 100 is heated under pressure to a temperature close to the softening temperature of the film. Then, the cover member 100 for each chip is coupled to the respective chip. In one embodiment, the coupling portion 101 of the respective cover member 100 adheres to the substrate 10 due to the stickiness of resin. More specifically, the coupling portion 101 of the cover member 100 adheres to the area on the periphery of the sensing portions 20, 31, and 41, over the pads 25a, 30a, 40a and over the surface of the semiconductor substrate 10. Once the cover member 100 is attached, the sensing portions 20, 31, 41 are covered by the covering portion 103. That is, the cover member 100 is coupled to the rectangular frame-like peripheral portion around the opening 15 so that the pads 25a, 30a, 40a are covered, as illustrated in FIG. 1.

Subsequently, the semiconductor wafer with the attached cover members 100 is cut into individual chips by dicing cut or the like. During this cutting step, the sensing portions 20, 31, 41 are protected by the cover member 100.

Next, wire bonding is carried out for an individual chip between the portions of the cover member 100 positioned above the pads 25a, 30a, 40a and the circuit chip. The wire bonding is carried out so that the above-mentioned deformation due to wire bonding occurs in the cover member 100.

More specifically, in this wire bonding step, the bonding wires 200 are pressed against the cover member 100 toward the pads 25a, 30a, 40a. Thus, the cover member 100 is deformed so that the bonding wires 200 and conductive particles 102 are brought into contact with each other and the pads 25a, 30a, 40a and conductive particles 102 are brought into contact with each other. As a result, electrical continuity between the pads 25a, 30a, 40a and the bonding wires 200 is provided via the conductive particles 102.

Thus, the above-mentioned pad-wire electrical connections 110 are formed. As a result, the semiconductor acceleration sensor S1 in this embodiment, illustrated in FIG. 1 to FIG. 4, is completed.

It will be appreciated that, in this embodiment of the semiconductor acceleration sensor S1, the cover member 100 covers the sensing portions 20, 31, 41 and is also separated at a distance from the sensing portions 20, 31, 41. Therefore, contact between the cover member 100 and the sensing portions 20, 31, 41 is unlikely, and displacement of the movable portion 20 due to application of acceleration is unlikely to be hindered. Further, the cover member 100 protects the sensing portions 20, 31, 41 from foreign matter. For this reason, the sensing portions 20, 31, 41 are appropriately protected, and sensor characteristics can be appropriately maintained.

In addition, as mentioned above, this cover member 100 can be easily formed by die forming or the like, and the cover member 100 can be coupled to the semiconductor substrate 10 by applying pressure or the like. Thus, the cover member 100 can be attached in a relatively simple manner, especially as compared to cover members made of semiconductive material of the prior art.

The pads 25a, 30a, 40a are provided under the coupling portion 101 of the cover member 100. Electrical continuity between the pads 25a, 30a, 40a and the bonding wires 200 is provided by forming the above-mentioned pad-wire electrical connections 110. Therefore, signals can be output from the sensing portions 20, 31, 41 via the bonding wires 200.

Furthermore, because the pads 25a, 30a, 40a are positioned under the coupling portion 101 of the cover member 100, the size of the semiconductor sensor S1 can be relatively small. This is because extra room need not be provided for attachment of the cover member 100 between the sensing portions 20, 31, 41 and the pads 25a, 30a, 40a. Thus, the semiconductor sensor S1 is more compact than those of the prior art.

Figure 5:
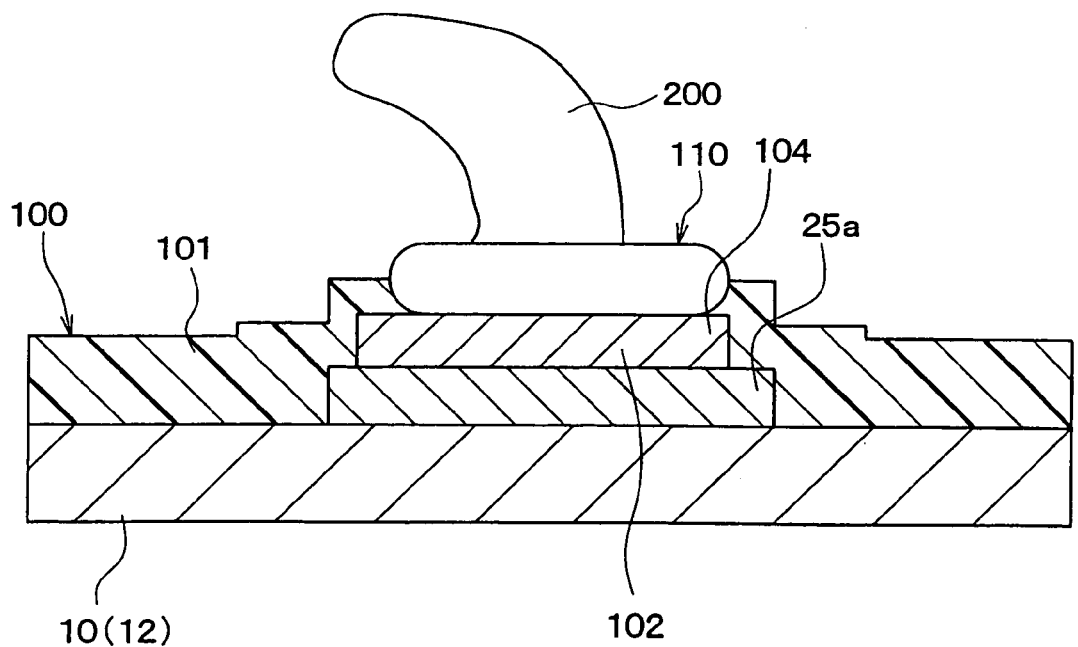
FIG. 5 is a schematic sectional view illustrating another embodiment of the semiconductor sensor.

Referring now to FIG. 5, another embodiment is shown. In this embodiment, the conductive members 104 are metal plates disposed in the cover member 100. The metal plate 104 is formed of plate-like metal, such as copper, aluminum, iron, or the like. This embodiment of the cover member 100 can be manufactured by insert-molding the metal plates 104 together with the resin of the cover member 100 or by a like method.

The pad-wire electrical connections 110 in this example are formed by carrying out wire bonding on the pads 25a, 30a, 40a, which are covered with the coupling portion 101 of the cover member 100. More specifically, the coupling portion 101 of the cover member 100 is deformed by pressing the bonding wires 200 against it, and the bonding wires 200 penetrate through the cover member 100 at those locations to contact the corresponding metal plate 104. The metal plate 104 also contacts the corresponding pad 25a, 30a, 40a. Thus, the bonding wires 200 and the pads 25a, 30a, and 40a are brought into electrical communication with each other via the metal plates 104.

Figure 6:
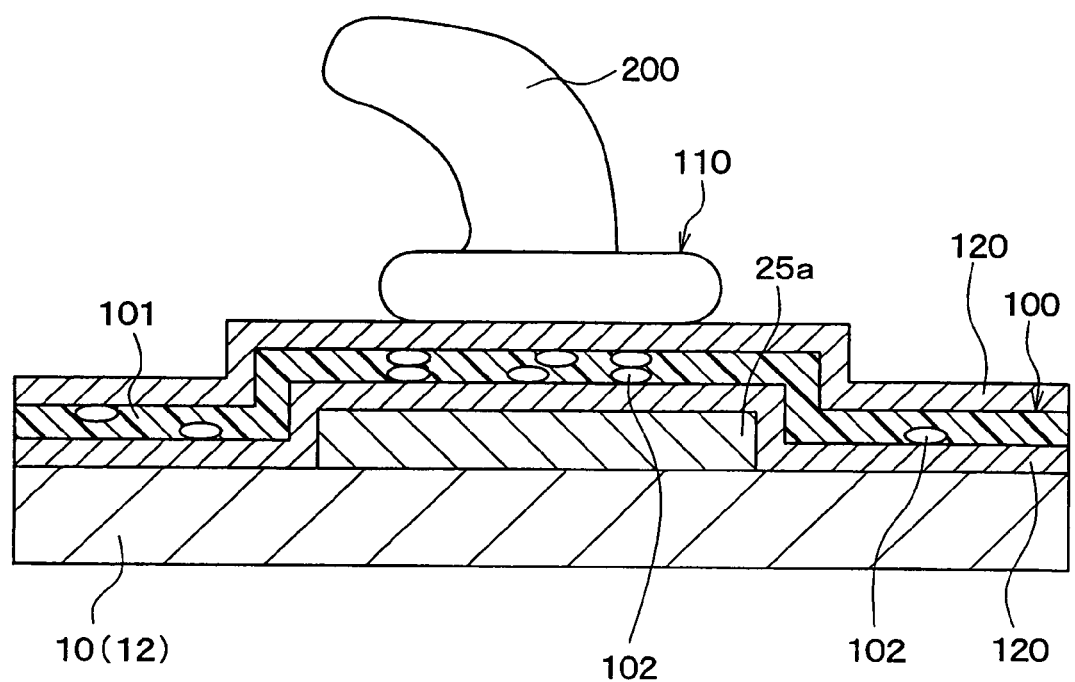
FIG. 6 is a schematic sectional view illustrating another embodiment of the semiconductor sensor.
Figure 7:
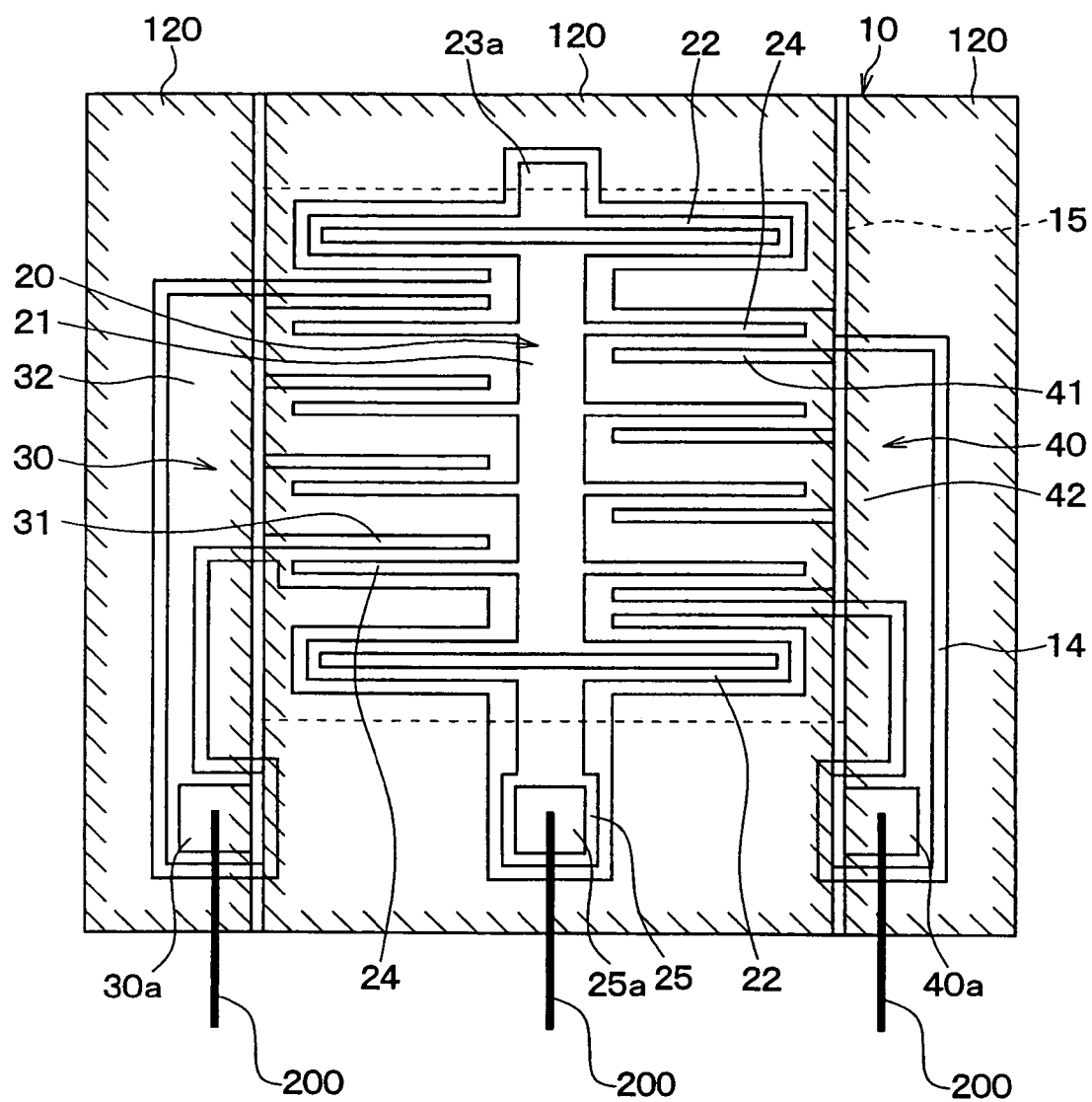
FIG. 7 is a schematic plan view of the semiconductor sensor of FIG. 6.

Referring now to FIGS. 6 and 7, another embodiment is illustrated. As shown, a metal foil 120 is included in the semiconductor sensor. In the embodiment shown, metal foil 120 is affixed to opposite surfaces of the cover member 100. The areas extended from the peripheral portions to the outer circumferential edges of the metal foil 120 are hatched for making the planar shape of the metal foil 120 clearly understandable.

This metal foil 120 can be formed of thin gold foil or the like. Also, in one embodiment, the cover member 100 with the metal foil 120 affixed thereto is formed by die forming. For example, melted resin 101 containing conductive particles 102 is poured between sheets of metal foil 120 to form the cover member 100. In the cover member 100 with metal foil 120, the cover portion 103 is formed by subjecting the cover member 100 to press forming, suction forming, or the like as described above. Similar to the embodiment described above, the cover member 100 of FIGS. 6 and 7 is coupled to the substrate 10 by applying heat and pressure. In this case, the metal foil 120 and the substrate 10 are bonded to each other by chemisorption or the like.

Also, the pad-wire electrical connections 110 are formed by wire bonding on the pads 25a, 30a, 40a, which are covered with by the cover member 100. More specifically, as shown in FIG. 6, the cover member 100 is deformed and thinned over the pads 25a, 30a, 40a by pressing the bonding wires 200 against the cover member 100. Pressing force from the bonding wire 200 brings the conductive particles 102 into contact with each other as shown in FIG. 6, and as a result, the bonding wire 200 is in electrical communication with the corresponding pad 25a, 30a, 40a via the conductive particles 102 and the metal foil 120.

In the embodiment shown in FIG. 7, the metal foil 120 is divided into three regions on both sides of the cover member 100. It is separated in correspondence with the individual sensing portions 20, 31, 41. That is, the metal foil is separated in correspondence with three members: the movable portion 20, the left-side fixed electrodes 31, and the right-side fixed electrodes 41. In other words, the metal foil 120 is electrically separated in correspondence with the individual sensing portions 20, 31, 41. The metal foil 120 covers the individual sensing portions 20, 31, 41 together with the wiring portions and pads that are at the same potential as them, and the metal foil 120 electrically shields them. Thus, in the embodiment shown in FIGS. 6 and 7, the sensing portions 20, 31, 41 are electrically shielded by the metal foil 120.

More specifically, there is a possibility that the sensing portions 20, 31, 41 could malfunction due to exogenous noise, such as electromagnetic waves. For instance, where the sensor S1 is used to detect acceleration of an automobile, exogenous noise may be caused by ignition noise and the like. Change in the capacitance between the movable and fixed electrodes generates a detection signal. Thus, there is a possibility that exogenous noise can have deleterious effect (i.e., the noise can be superimposed on detection signals). However, the metal foil 120 affixed to the cover member 100 covers the sensing portions 20, 31, 41 to electrically shield the sensing portions 20, 31, 41 against exogenous noise. Thus, the sensor S1 can detect more accurately.

It will be appreciated that the conductive members 102, 104 provided in the cover member 100 need not be included in the cover member 100 in the embodiment of FIGS. 6 and 7.

Figure 8A:
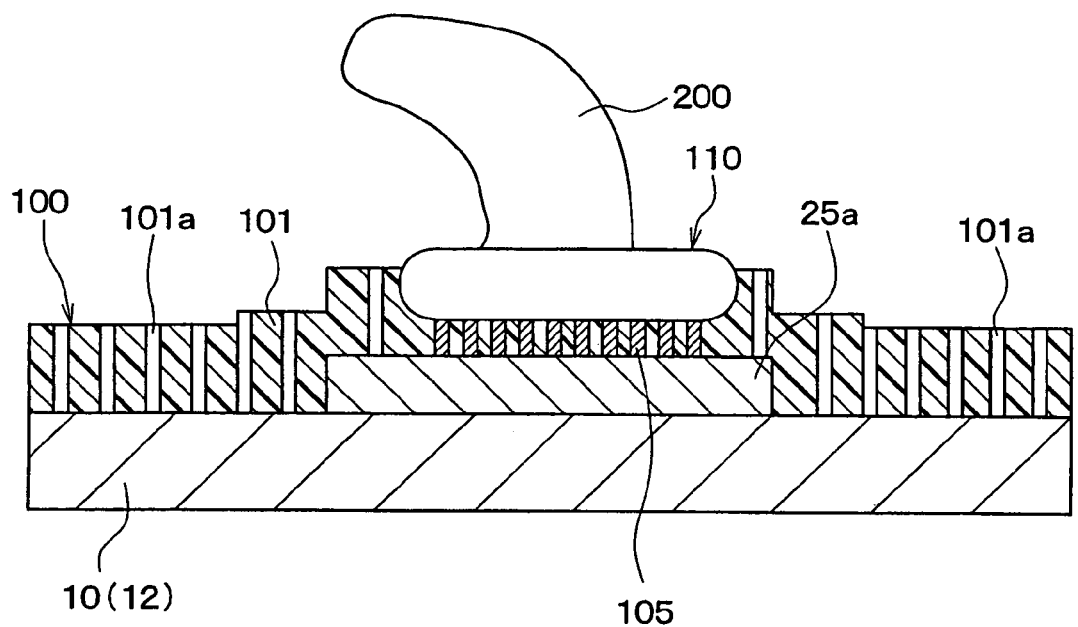
FIGS. 8A and 8B are schematic sectional views illustrating another embodiment of the semiconductor sensor.
Figure 8B:
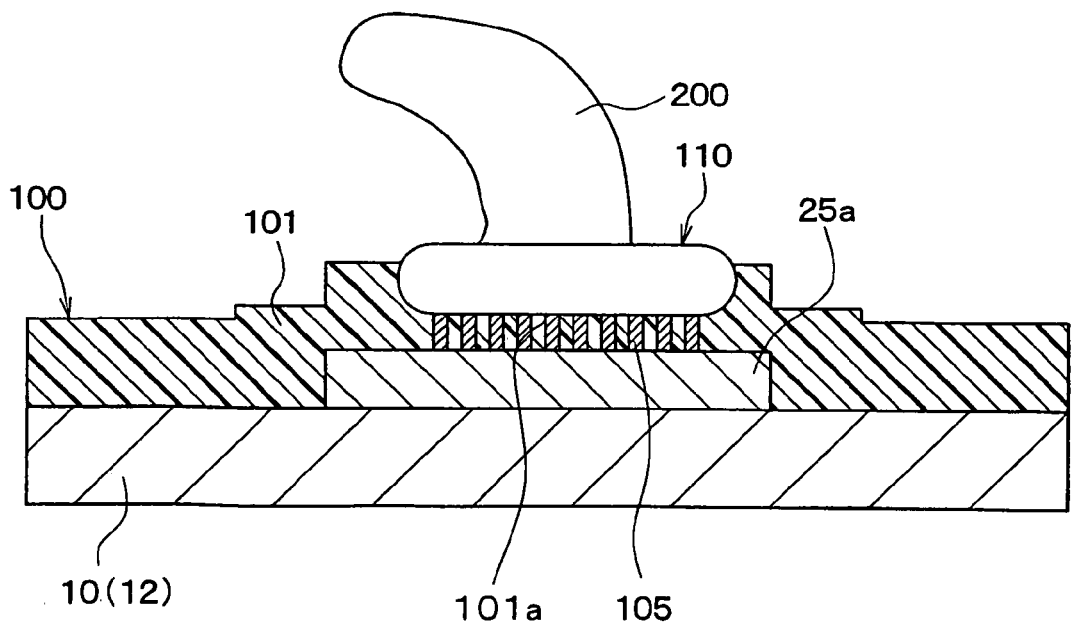

Referring now to FIGS. 8A and 8B, another embodiment is illustrated. As shown, the cover member 100 includes a plurality of pores 101a. In the embodiment of FIG. 8A, substantially the entire cover member 100 includes the pores 101a. In contrast, in the embodiment of FIG. 8B, pores 101a are included locally above portions corresponding to the pads 25a, 30a, 40a. The pores 101a can be formed by forming the cover member 100 of resin foam or the like, forming the pores 101a by etching or a needle-like jig, or another suitable method.

Furthermore, in the embodiment of FIGS. 8A and 8B, the pad-wire electrical connections 110 are formed by wire bonding on the regions over the pads 25a, 30a, 40a. For example, the end portions of the bonding wires 200 can be partly melted by energy to flow into the pores 101a to contact the corresponding pad 25a, 30a, 40a. In FIGS. 8A and 8B, the so-called "flow portion" (i.e., the melted portion) is labeled with the reference numeral 105. The flow portions 105 are made of a conductive material to thereby bring the bonding wires 200 into electrical communication with the corresponding pad 25a, 30a, 40a.

As illustrated in FIGS. 8A and 8B, the cover member 100 is also deformed (i.e., thinned) by pressing the bonding wires 200 against them. In addition, electrical continuity is provided between the bonding wires 200 and the corresponding pads 25a, 30a, 40a via the flow members 105 within the fine pores 101a.

In the above-mentioned embodiments, conductive members 102, 104 are contained in the cover member 100. Then, anisotropic conductive connection is implemented by pressing the bonding wires 200 into the cover member 100. However, the pad-wire electrical connections 110 are not limited to this construction.

Figure 9A:
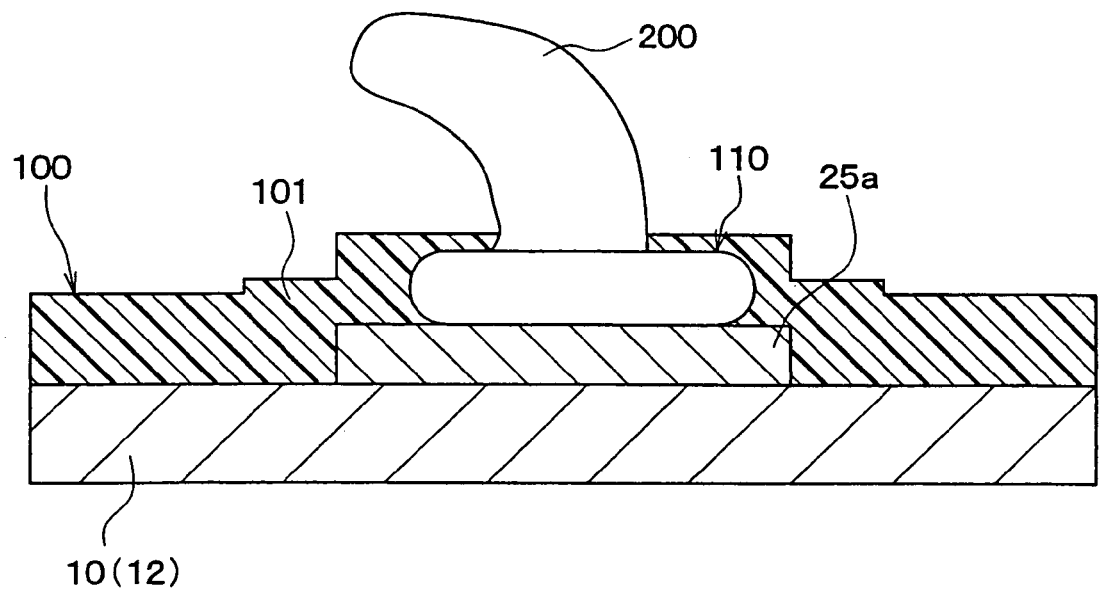
FIGS. 9A and 9B are schematic sectional views illustrating other embodiments of the semiconductor sensor.
Figure 9B:
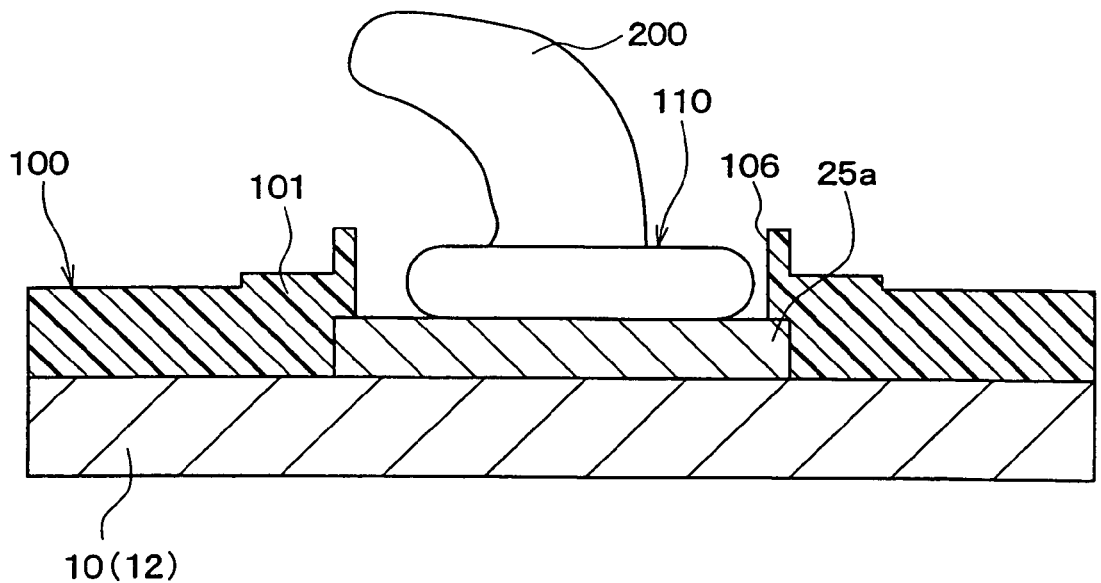

For example, pad-wire electrical connections 110 may be formed as illustrated in FIG. 9A. That is, the pad-wire electrical connections 110 may be formed by pressing the bonding wires 200 into the cover member until the bonding wires 200 penetrate through the cover member 100 and contact the corresponding pads 25a, 30a, 40a.

In another embodiment, the cover member 100 includes a plurality of openings 106 in an area above the pads 25a, 30a, 40a. The openings 106 expose a portion of a corresponding pad 25a, 30a, 40a and provides access to the corresponding pad 25a, 30a, 40a. The openings 106 can be formed by press work, die forming, or the like.

Thus, in this embodiment, the pad-wire electrical connections 110 have such openings 106. Continuity between pads and bonding wires can be provided through the openings 106 by carrying out wire bonding on the portions of the pads 25a, 30a, 40a exposed in the openings 106.

Furthermore, in the embodiments described above with conductive particles 102, the conductive particles 102 are dispersed throughout the cover member 100. However, the conductive particles 102 can also be locally included in portions of the cover member 100 corresponding to the pads 25a, 30a, 40a without departing from the scope of the present disclosure.

In addition, in the embodiment of the cover member 100 with the metal foil 120, the metal foil 120 can be included on only one surface of the cover member 100 without departing from the scope of the present disclosure. Furthermore, in the cover member 100 illustrated in FIG. 6, metal plates 104 (FIG. 5) may be used in place of the conductive particles 102 without departing from the scope of the present disclosure.

Additionally, in the manufacturing method for the sensor S1, multiple attached cover members 100 are coupled to the semiconductor substrates 10 in the form of wafer (i.e., a semiconductor wafer), and then the individual chips are separated. In another embodiment, individual cover members 100 are formed, and the cover member 100 are coupled to individual chips.

Moreover, any other material than polyimide can be used for the cover member 100.

Still further, the sensor S1 may be of any suitable type, such as an acceleration sensor, an angular speed sensor, or any other semiconductor mechanical quantity sensor, etc. These semiconductor mechanical quantity sensors include, over one surface of a semiconductor substrate 10, movable electrodes 24 that can be displaced by application of a mechanical quantity and fixed electrodes 31, 41 placed opposite to the movable electrodes 24. The sensors also include pads 25a, 30a, 40a on the periphery of both the electrodes 24, 31, 42 over the one surface of the semiconductor substrate 10, and bonding wires 200 are electrically connected to the pads 25a, 30a, 40a for transmitting signals output by the pads 25a, 30a, 40a. The sensor S1 may also be an SAE filter element used in cellular phones and the like and detect a predetermined frequency of radio waves.

Thus, while only the selected embodiments have been chosen to illustrate the present invention, it will be apparent to those skilled in the art that various changes and modifications can be made therein without departing from the scope of the invention as defined in the appended claims. Furthermore, the foregoing description of the embodiments according to the present invention is provided for illustration only, and not for the purpose of limiting the invention as defined by the appended claims and their equivalents.

What is claimed is:

1. A semiconductor sensor comprising:
    a semiconductor substrate;
    a sensing portion provided on the semiconductor substrate;
    a pad in electrical communication with the sensing portion and provided on the semiconductor substrate;
    a bonding wire in electrical communication with the pad; and
    a cover member comprising a covering portion disposed over the semiconductor substrate for covering the sensing portion such that the covering portion is separated at a distance from the sensing portion, wherein the cover member is a resin film, and the cover member further comprises a coupling portion provided on the semiconductor substrate at an area including the pad and for enabling electrical connection of the pad with the bonding wire therethrough, wherein the bonding wire passes through the cover member so as to contact the pad.

2. The semiconductor sensor according to claim 1, wherein the cover member is deformed by pressing the bonding wire against the cover member so that the bonding wire passes through the cover member.

3. The semiconductor sensor according to claim 1, wherein the bonding wire extends from an outer surface of the cover member to a location that is spaced apart from the cover member.

4. The semiconductor sensor according to claim 1, wherein the covering portion is dome shaped and protrudes away from the sensing portion.

5. A method of manufacturing a semiconductor sensor comprising:
    providing a sensing portion on a semiconductor substrate;

providing a pad in electrical communication with the sensing portion on the semiconductor substrate;

providing a cover member comprising a covering portion and a coupling portion, wherein the cover member is a resin film;

providing the coupling portion of the cover member on the semiconductor substrate on an area including the pad such that the covering portion covers the sensing portion and such that the covering portion is separated at a distance from the sensing portion; and electrically coupling a bonding wire to the pad through the coupling portion for transmission of signals output by the sensing portion, wherein electrically coupling the bonding wire includes passing the bonding wire through the cover member such that the bonding wire contacts the pad.

6. The method according to claim 5, wherein the covering portion is dome shaped and protrudes away from the sensing portion.

7. The method according to claim 5, wherein the cover member is deformed by pressing the bonding wire against the cover member so that the bonding wire passes through the cover member.

8. The method according to claim 5, wherein the bonding wire is extended between the pad and a location that is spaced apart from the cover member.

* * * * *